(12) United States Patent
Cheng et al.

(10) Patent No.: US 7,230,222 B2
(45) Date of Patent: Jun. 12, 2007

(54) CALIBRATED LED LIGHT MODULE

(75) Inventors: Heng Yow Cheng, Penang (MY); Kee Yean Ng, Penang (MY); Joon Chok Lee, Sarawak (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/205,580

(22) Filed: Aug. 15, 2005

(65) Prior Publication Data

US 2007/0034775 A1   Feb. 15, 2007

(51) Int. Cl.
  *G01J 1/32*   (2006.01)
  *H01L 27/15*  (2006.01)
  *H01L 29/20*  (2006.01)

(52) U.S. Cl. ............................. 250/205; 257/82; 257/89

(58) Field of Classification Search ................. 250/205; 257/80, 82, 89; 362/800
See application file for complete search history.

(56) References Cited

U.S. PATENT DOCUMENTS

| | | | |
|---|---|---|---|
| 4,124,860 A * | 11/1978 | Johnson | 257/82 |
| 6,611,000 B2 * | 8/2003 | Tamura et al. | 257/80 |
| 6,998,594 B2 * | 2/2006 | Gaines et al. | 250/205 |
| 7,135,664 B2 * | 11/2006 | Vornsand et al. | 250/205 |
| 2002/0047624 A1 * | 4/2002 | Stam et al. | 315/291 |
| 2003/0057533 A1 * | 3/2003 | Lemmi et al. | 257/678 |
| 2003/0116694 A1 * | 6/2003 | Maeda | 250/205 |
| 2006/0000963 A1 * | 1/2006 | Ng et al. | 250/205 |
| 2006/0076056 A1 * | 4/2006 | Schmitt et al. | 137/216 |

* cited by examiner

*Primary Examiner*—Thanh X. Luu
*Assistant Examiner*—Brian Livedalen

(57) ABSTRACT

A light source and method for making the same are disclosed. The light source includes a plurality of LEDs mounted on a substrate and a sensor for measuring light from the LEDs. Each LED emits light having a different spectrum from the other LEDs, the average intensity of light from that LED being determined by a drive signal coupled to that LED. The sensor generates a plurality of signals, each signal being characterized by a sensor value that is proportional to the intensity of light emitted by a corresponding one of the LEDs. A controller generates the drive signals and stores a current target value for each LED. The drive signals for each of the LEDs is generated such that the sensor value for that LED matches the stored current target value for that LED.

10 Claims, 2 Drawing Sheets

CALIBRATED LED LIGHT MODULE

BACKGROUND OF THE INVENTION

Light emitting diodes (LEDs) are attractive candidates for replacing conventional light sources such as incandescent lamps and fluorescent light sources. The LEDs have higher light conversion efficiencies and longer lifetimes. Unfortunately, an LED produces light in a relatively narrow spectral band. Hence, to produce a light source having an arbitrary color, a compound light source having multiple LEDs is typically utilized or part of the light from a single LED must be converted to light of a second wavelength, which is mixed with light from the original LED. For example, an LED-based white light source that provides an emission that is perceived as white by a human observer can be constructed by combining light from arrays of red, blue, and green emitting LEDs that are generating the correct intensity of light at each color. Similarly, light of other spectral emissions can be produced from the same arrays by varying the intensity of the red, blue, and green LED outputs to produce the desired color output. The intensity of light from each array can be varied by varying the magnitude of the current through the LED or by switching the LEDs on and off with a duty cycle that determines the average intensity of light generated by the LEDs.

A light source designer typically knows the desired output color for a light source in terms of standardized red, blue, and green light intensities. If the individual LEDs were highly reproducible and had light outputs that did not vary over the life of the LED, a light source constructed from red, blue, and green LEDs could be utilized to provide the intensities of the light from the individual colors by providing a drive circuit that drives each LED with the appropriate current or duty factor.

Unfortunately, the LED fabrication process provides LEDs having emissions and efficiencies that vary significantly from one LED to another even for LEDs of a particular type. In addition, the light output of an LED changes over time as the LED ages. If the designer constructs an LED lighting system by assuming that the LEDs are all the same, the variations lead to color shifts in the perceived spectrum of the light. Such variations are often unacceptable.

One solution to this problem involves selecting the LEDs such that the selected LEDs have precisely the correct emission efficiency and spectrum. Here, the individual LEDs are tested after fabrication. The LEDs that have the same output wavelength and current-to-light conversion efficiency to within some predetermined variation are grouped together. In essence, the LEDs are sorted into sub-types that have known parameters that are more tightly controlled. The light source designer can then specify a light source in terms of the sub-groups to avoid the manufacturing variability problem described above. Unfortunately, this solution reduces the production yield and increases the cost.

In addition, the sorting process does not solve the aging problems discussed above, and hence, the light source may still exhibit a color shift as it ages. To correct for the aging problem, a sensor is normally used to measure the intensity of light from the light source at the red, green, and blue wavelengths. A feedback control system then adjusts the drive currents or duty factors to the individual LEDs to maintain the color output at the desired point.

While a feedback system can correct for the aging of the LEDs, such systems are difficult to implement in a stand-alone light source designed to replace a conventional incandescent bulb. The LEDs are typically mounted on a first substrate in close proximity to one another. The light from the individual LEDs is mixed by a lens or other optical arrangement to provide the output light. The sensor must be located in the output light, and hence, must be located some distance from the LEDs. The controller drive circuitry is also typically mounted on a second substrate.

SUMMARY OF THE INVENTION

The present invention includes a light source and method for making the same. The light source includes a plurality of LEDs mounted on a substrate and a sensor for measuring light from the LEDs. Each LED emits light having a different spectrum from the other LEDs. Each LED generates light of an average intensity that is determined by a drive signal coupled to that LED. The sensor generates a plurality of signals, each signal being characterized by a sensor value that is proportional to the intensity of light emitted by a corresponding one of the LEDs. The LEDs are encapsulated in the transparent cap. A controller generates the drive signals and stores a current target value for each LED. The drive signals for each of the LEDs is generated such that the sensor value for that LED matches the stored current target value for that LED. In one embodiment, the controller stores the current values of the sensor values as the current target values in response to an external control signal being coupled to the controller. In one embodiment, the sensor is mounted on the substrate. In one embodiment, the sensor measures light leaving a sidewall of one of the LEDs. In one embodiment, the sensor measures light reflected from a boundary of the transparent cap. In one embodiment, the transparent cap includes a lens. In one embodiment, the controller stores a plurality of sets of target values, and wherein the controller selects one of the sets of target values for the current target value in response to an external signal that is connected thereto. In one embodiment, an external calibration controller causes the LEDs to generate light corresponding to a predetermined color point. The controller in the light source is then caused to store the sensor values as the target values.

DETAILED DESCRIPTION OF THE PREFERRED EMBODIMENTS OF THE INVENTION

Figure 1:
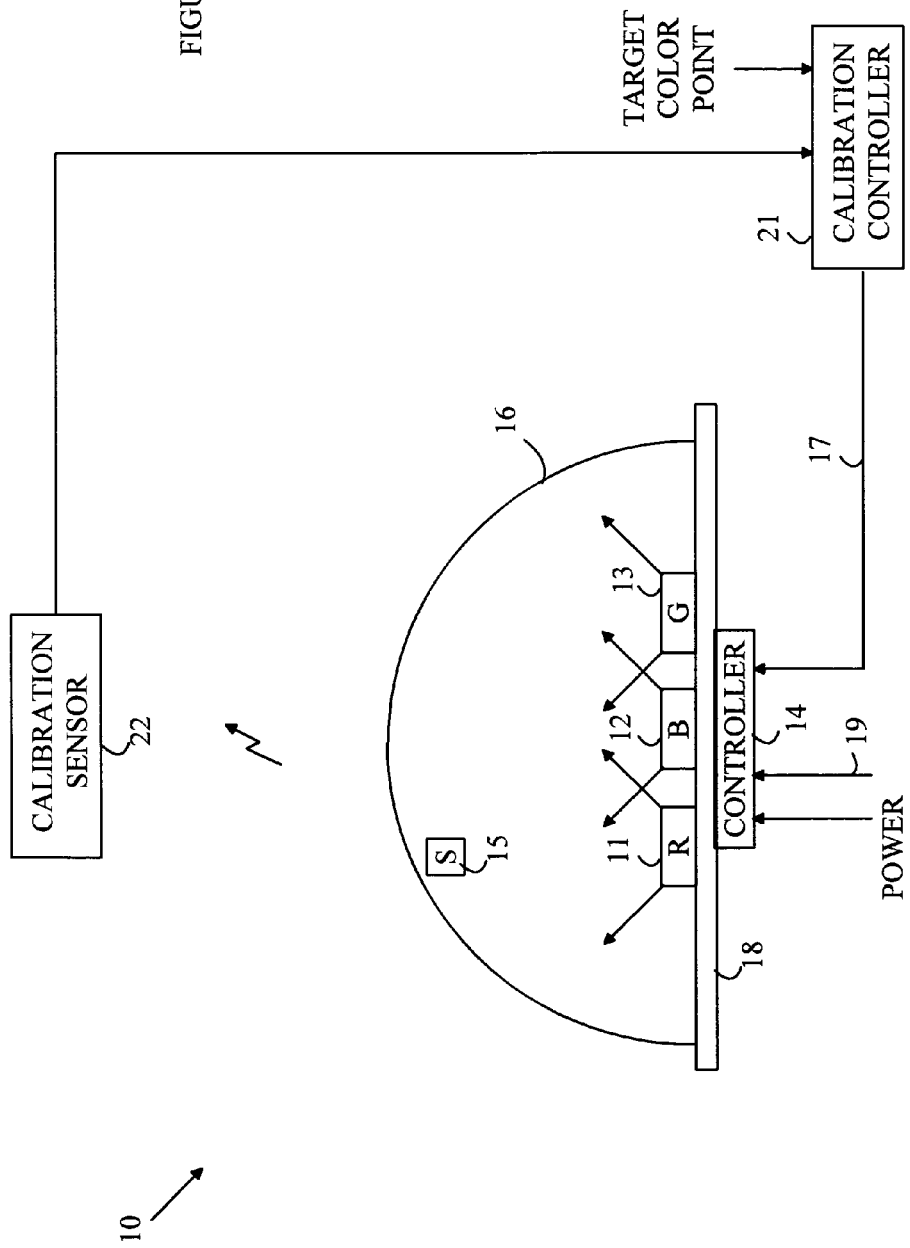
FIG. 1 illustrates a light source according to one embodiment of the present invention.

The present invention is based on the observation that a feedback system can also be used to correct a significant fraction of the manufacturing variability and that the feedback sensor need not be located at a distance from the LEDs that is sufficient to assure that it receives only the final mixed light signal. The manner in which the present invention provides its advantages can be more easily understood with reference to FIG. 1, which illustrates a light source according to one embodiment of the present invention. To simplify the following discussion, light source 10 has only three LEDs shown at 11-13. These LEDs emit red, blue, and green light respectively. Embodiments that utilize multiple LEDs of each color will be discussed in more detail below.

The light level generated by each LED is determined by a light source controller 14 that varies the current through each LED and/or the duty cycle of each LED. Controller 14 includes the various drive circuits and power conversion circuits needed to supply the appropriate drive currents to the LEDs. The power input to controller 14 can be either DC or AC, depending on the specific application. For example, in the case of an incandescent light replacement for home use, the input power would be AC and controller 14 would include the appropriate rectification circuitry to convert the AC power to DC for driving the LEDs. In contrast, a light source intended for a bulb replacement in an automobile or flashlight would operate on DC power. In this case, controller 14 could include a current source that runs directly from the DC power to provide the required drive currents.

Light source 10 also includes a sensor 15 that generates signals indicative of the amount of light reaching that sensor in each of the color bands corresponding to LEDs 11-13. To simplify the present discussion, it will be assumed that sensor 15 includes three photodiodes with color filters chosen such that each photodiode measures light originating from only a corresponding one of the LEDs.

Sensor 15 can be placed at any location at which sensor 15 receives sufficient light from each of the LEDs to provide a signal having a sufficient signal-to-noise ratio to allow the light intensity from each LED to be determined. To simplify the drawings, the connections between sensor 15 and light source controller 14 have been omitted. However, it is to be understood that sensor 15 and the LEDs are connected electrically to light source controller 14. It will be assumed that sensor 15 generates three signals, each representing the amount of light received from a corresponding one of the LEDs multiplied by a calibration constant. The calibration constant depends on the relative placement of the sensor to the LEDs, the size of the photodiodes, the amount of light lost in the filters, and the efficiency with which each photodiode converts light of the wavelengths passed by the filters into an electrical signal. For any particular set of LEDs and sensor, the calibration constants are fixed once the light source is assembled. In this regard, it should be noted that the components are typically encapsulated in a clear medium that also acts as a lens 16 for mixing and imaging the light from the source in the far field. The various components are typically connected to a substrate 18 that includes the electrical traces needed to make the connections discussed above.

Consider the case in which light source 10 is designed to provide light of a specified color point in the color space. That target color point is characterized by a particular set of RBG values in a standardized color scheme such as the CIE color coordinates. After light source 10 has been fabricated, light source 10 is connected to a calibration apparatus that includes a calibration sensor 22 and a calibration controller 21. Calibration sensor 22 is located at a sufficient distance from light source 10 to assure that the light received by calibration sensor 22 is well mixed and represents the light generated by light source 10 in the far field.

Calibration sensor 22 is calibrated such that calibration sensor 22 provides the RBG values in CIE color coordinates for the light reaching calibration sensor 22. The target color point in the same color coordinate system is input to calibration controller 21. During the calibration process, calibration controller 21 controls the amount of light generated by each of the LEDs by sending commands to controller 14 over a connection bus 17. During the calibration procedure, the calibration controller varies the light levels generated by the LEDs until the light levels sensed by calibration sensor 22 match the target values. At this point, light source controller 14 is instructed to read and store the signal values from sensor 15 in a non-volatile memory within controller 14. Light source controller 14 is then switched to its running mode.

During normal operation, light source controller 14 adjusts the drive currents and/or duty cycles such that the values generated by sensor 15 match the stored values determined during the calibration process. It should be noted that the light source is calibrated without ever explicitly computing the calibration constants associated with sensor 15. However, those calibration constants can be computed by calibration controller 21 or light source controller 14 by observing the changes in the signals from sensor 15 when various drive currents are supplied to each LED and correlating those changes with the changes in the corresponding color coordinates from calibration sensor 22.

In some applications, it would be advantageous to be able to change the color point of light source 10 during actual operation. For example, consider a light source that is to provide light that is perceived to be white by a human observer. Light source 10 can provide an input that allows the user to change the apparent color temperature of the light from light source 10. If the calibration constants for sensor 15 are known and light source controller 14 stores the relationship between the color sensor outputs and the curve in the color space corresponding to a white light source having different color temperatures, then light source controller 14 can determine the new target sensor values for sensor 15 that must be maintained at the new color temperature setting. The desired color temperature can be input on bus 17 or on a separate color input 19. Alternatively, light source 10 could be programmed to step through a number of color temperature settings each time it is toggled on and off in a manner analogous to that used for multiple intensity incandescent lamps.

It should be noted that a multiple color light source can also be implemented by repeating the calibration process discussed above for each of the desired color points and storing the resulting readings from sensor 15 for each of the color points in light source controller 14. In such embodiments, the calibration constants for sensor 15 are not explicitly needed.

As noted above, the intensity of light from an LED can be controlled either by changing the drive current or by altering the duty cycle of the drive signal. If the duty cycle is altered, then sensor 15 can include a low-pass filter to convert the signal from each photodiode to an average intensity signal that is then utilized by light source controller 14 in the feedback loop.

The above-described embodiments of the present invention utilize a sensor that is placed above the LEDs. However, in general, designs in which the sensor is mounted on substrate 18 are more easily constructed. As noted above, sensor 15 can be placed at any location at which there is sufficient light to provide a signal for each LED. Actually, sensor 15 can be viewed as three separate light intensity sensors, one corresponding to each LED. Hence, sensor 15 could be split into its component sensors and each component sensor could then be located at a different position within the light source to optimize the light signal from the corresponding LED.

It should also be noted that lens 16 has an index of refraction that is significantly different from that of the air outside the light source. Hence, some portion of the light from each of the LEDs will be reflected back toward substrate 18 by the interface between lens 16 and the air outside the lens. In addition, lens 16 may include scattering material that facilitates the mixing of the light from the LEDs. A portion of the scattered light will also be available for detection by a sensor that is mounted on substrate 18.

Figure 2:
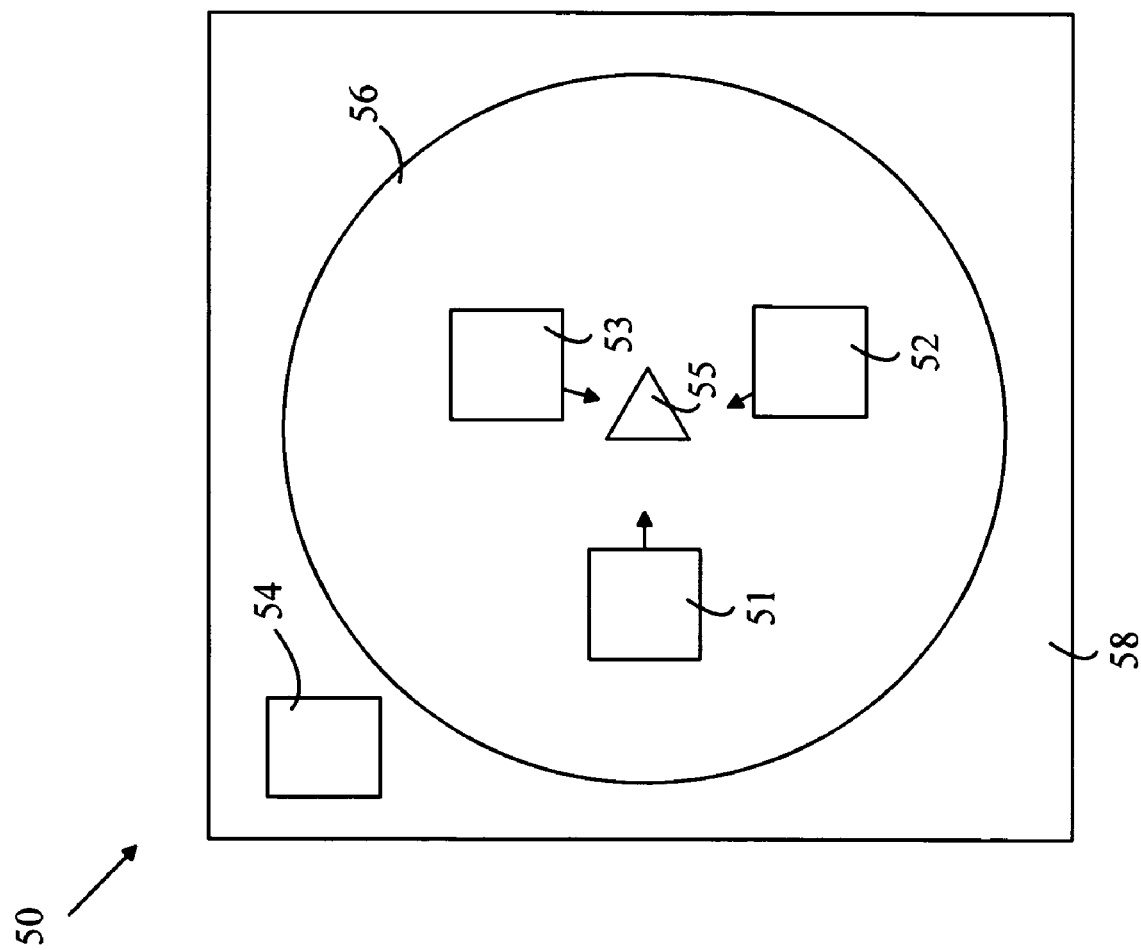
FIG. 2 is a top view of a light source 50 according to another embodiment of the present invention.

Refer now to FIG. 2, which is a top view of a light source 50 according to another embodiment of the present invention. Light source 50 includes three LEDs 51-53 that emit red, blue, and green light, respectively. The LEDs and a sensor 55 that measures the intensity of the light leaving each LED are mounted on substrate 58 and encapsulated in a transparent cap 56. The LEDs are driven by a controller 54 that operates in a manner analogous to controller 14 discussed above with reference to FIG. 1.

In this embodiment, sensor 55 is designed to receive light leaving each of the LEDs through the sidewall of the LED dies. LED dies 51-53 each emit some of the light generated therein through the sidewall of the dies. This light is light that was trapped within the LED by being reflected off layers in the LED at angles greater than the critical angle. Some of this light reaches the sidewall of the LED before it is absorbed. Since the light strikes the sidewall at an angle less than the critical angle, the light exits the sidewall. The amount of light exiting the sidewall of each LED is proportional to the light emitted from the top surface of the LED, and hence, this light signal can be used to monitor the light output of the LED.

Sensor 55 includes three photodiodes. Each photodiode is positioned to receive light from a corresponding one of the LEDs. That is, the photodiodes measure light that is traveling in a direction that is roughly parallel to the surface of substrate 58. If each photodiode is constructed such that the photodiode only receives light from a cone of angles that is sufficiently small to prevent light from the other LEDs reaching the photodiode, the wavelength filters in front of the photodiodes can be omitted. Alternatively, wavelength filters can be used in front of the photodiodes to provide the needed selectivity.

The arrangement shown in FIG. 2 can also be used with a sensor that measures light received thorough the top surface of the sensor. Such an arrangement can be used in embodiments in which the reflected or scattered light discussed above is used to monitor the amount of light generated in each LED.

The above-described embodiments of the present invention utilize three LEDs that emit light in the red, blue, and green wavelength bands, respectively. However, other numbers of LEDs and different colors can also be utilized depending on the particular application. For example, light sources based on four colors can provide a light source with significantly better color rendering than light sources based on three LEDs as described above.

The embodiments of the present invention described above utilize a sensor that generates a plurality of signals. Each signal represents the intensity of the light generated in a corresponding LED. There are a number of ways in which such a sensor can be constructed. For example, as noted above, the sensor can be constructed from a plurality of photodiodes, one corresponding to each of the LEDs. In this case, the photodiode corresponding to a particular LED must be able to receive some of the light generated by that LED. In the simplest case, the photodiode only detects light from its corresponding LED. This can be accomplished by proper positioning of the photodiode or by including a filter that blocks light from the LEDs.

Alternatively, photodiodes that detect light from the other LEDs can be used if the detection efficiency is different for different LEDs. In this case, each photodiode measures a weighted sum of the light from each of the LEDs. Denote the signal from the ith photodiode by $S_i$, and the intensity of light from the $j^{th}$ LED by $I_j$. Then, $S_i = W_{i,j} * I_j$ for I and j running from 1 to N, where N is the number of LEDs and photodiodes. The weights, $W_{i,j}$, can be measured when the light source is calibrated. Hence, the system of equations can be solved for the intensities from each of the LEDs. Controller 54 can provide the computational hardware for solving the system of equations in question.

If the LEDs are modulated at different frequencies, a single LED can be used to monitor all of the LEDs by measuring the output signal from that photodiode at each of the modulation frequencies.

In the above-described embodiments of the present invention, the photosensor was constructed from photodiodes. However, other photodetectors such as phototransistors can be utilized. As used herein, a photosensor is any device that generates a signal that is a function of the intensity of the light striking that device.

Various modifications to the present invention will become apparent to those skilled in the art from the foregoing description and accompanying drawings. Accordingly, the present invention is to be limited solely by the scope of the following claims.

What is claimed is:

1. A light source comprising:
    a substrate;
    a plurality of dies mounted on said substrate said dies being encapsulated in a transparent cap comprising a layer of material that extends around all of said dies, each die comprising an LED emitting light having a different spectrum from said other LEDs, each LED generating light of an avenge intensity that is determined by a drive signal connected to that LED;
    a sensor that generates a plurality of signals, each signal being characterized by a sensor value that is indicative of the intensity of light emitted by a corresponding one of said LEDs and independent of the intensity of light emitted by any other LED in said light source, said sensor comprising at least one photodetector that is encapsulated in said layer of material; and
    a controller that generates said drive signals and stores a current target value for each LED, wherein
    said light source operates in a calibration phase and an operation phase, wherein during said operation phase said controller generates said drive signals for each of said LEDs such that said sensor value for that LED matches said stored current target value for that LED, and wherein during said calibration phase, said controller stores said current target values.

2. The light source of claim 1 wherein said controller stores the current values of said sensor values as said current target values in response to an external control signal being coupled to said controller during said calibration phase.

3. The light source of claim 1 wherein said sensor is mounted on said substrate.

4. A light source comprising:
    a substrate;
    a plurality of LEDs mounted on said substrate and encapsulated in a transparent cap, each LED emitting light having a different spectrum from said other LEDs, each LED generating light of an average intensity that is determined by a drive signal connected to that LED;
    a sensor that generates a plurality of signals, each signal being characterized by a sensor value that is indicative of the intensity of light emitted by a corresponding one of said LEDs and independent of the intensity of light emitted by any other LED in said light source, said sensor comprising at least one photodetector that is encapsulated in said transparent cap; and a controller that generates said drive signals and stores a current target value for each LED, wherein said light source operates in a calibration phase and an operation phase, wherein during said operation phase said controller generates said drive signals for each of said LEDs such that said sensor value for that LED matches said stored current target value for that LED, and wherein during said calibration phase, said controller stores said current target values;

wherein said sensor measures light leaving a sidewall of a die that includes one of said LEDs.

5. The light source of claim 1 wherein said sensor measures light reflected from a boundary of said transparent cap.

6. The light source of claim 1 wherein said transparent cap comprises a lens.

7. The light source of claim 1 wherein said controller stores a plurality of sets of target values, and wherein said controller selects one of said sets of target values for said current target value in response to an external signal being connected thereto.

8. A method for fabricating a light source, said method comprising:

attaching a plurality of dies to a substrate, each die comprising an LED emitting light having a different spectrum from said other LEDs, each LED generating light of an average intensity that is determined by a drive signal connected to that LED; and providing a sensor that generates a plurality of signals, each signal being characterized by a sensor value that is indicative of the intensity of light emitted by a corresponding one of said LEDs and independent of the intensity of light emitted by any other LED in said light source;

encapsulating said LEDs and said sensor in a transparent cap comprising a layer of material that extends around all of said dies and said sensor;

attaching a controller to said substrate, said controller being connected to said LEDs and said sensor, said controller generating said drive signals and storing a current target value for each LED-wherein said light source operates in a calibration phase and an operation phase, wherein during said operation phase said controller generates said drive signals for each of said LEDs such that said sensor value for that LED matches said stored current target value for that LED, and wherein during said calibration phase, said controller stores said current target values;

causing said LEDs to generate light corresponding to a predetermined color point during said operation phase;

causing said controller to store said sensor values as said target values when said LEDs generate light of said predetermined color point during said calibration phase.

9. The method of claim 8 wherein said LEDs are caused to generate light corresponding to said predetermined color point by measuring light from said light source in a calibrated light detector separate from said light source and varying said drive signals until said calibrated light detector indicates that said light generated by said LEDs matches said predetermined color point to within a predetermined accuracy.

10. The method of claim 9 wherein said calibrated light detector receives light from all of said LEDs during said measurement.

* * * * *

UNITED STATES PATENT AND TRADEMARK OFFICE
CERTIFICATE OF CORRECTION

PATENT NO. : 7,230,222 B2 Page 1 of 1
APPLICATION NO. : 11/205580
DATED : June 12, 2007
INVENTOR(S) : Heng Cheng et al.

It is certified that error appears in the above-identified patent and that said Letters Patent is hereby corrected as shown below:

In Claim 1 (col. 6, line 8), delete "avenge" and insert --average--.

In Claim 8 (col. 8, line 8), delete "LED-wherein" and insert --LED, wherein--.

Signed and Sealed this

Twenty-second Day of July, 2008

JON W. DUDAS
*Director of the United States Patent and Trademark Office*